US007221561B2

(12) United States Patent

Pan et al.

(10) Patent No.: US 7,221,561 B2

(45) Date of Patent: May 22, 2007

(54) TELECOMMUNICATION APPARATUS HAVING A COUPLING MEMBER TO PREVENT UNTIMELY ACTUATION OF THE KEYPAD

(75) Inventors: Long-Jyh Pan, Hsi Chih (TW); Chun-Hao Chen, Taipei Hsien (TW)

(73) Assignee: Benq Corporation, Taoyuan (TW)

( * ) Notice: Subject to any disclaimer, the term of this patent is extended or adjusted under 35 U.S.C. 154(b) by 0 days.

(21) Appl. No.: 11/315,954

(22) Filed: Dec. 22, 2005

(65) Prior Publication Data

US 2006/0141813 A1 Jun. 29, 2006

(30) Foreign Application Priority Data

Dec. 24, 2004 (TW) ............................. 93140559 A

(51) Int. Cl.

*G06F 1/16* (2006.01)
*H05K 5/00* (2006.01)
*H05K 7/00* (2006.01)

(52) U.S. Cl. ...................... 361/680; 439/32; 455/575.3

(58) Field of Classification Search .................. 439/32, 439/677, 678, 684, 640; 361/680; 455/575.3, 455/90.3

See application file for complete search history.

(56) References Cited

U.S. PATENT DOCUMENTS

| | | | | |
|---|---|---|---|---|
| 5,490,037 | A * | 2/1996 | Clancy | 361/680 |
| 5,532,904 | A * | 7/1996 | Sellers | 361/680 |
| 5,594,618 | A * | 1/1997 | Sellers | 361/680 |
| 5,768,094 | A * | 6/1998 | Merkel | 361/680 |
| 6,314,274 | B1 * | 11/2001 | Kumagai | 455/90.3 |
| 6,529,370 | B1 | 3/2003 | Kamishima | |
| 6,747,867 | B2 * | 6/2004 | Hsu | 361/680 |
| 7,129,928 | B2 * | 10/2006 | Young et al. | 345/161 |

* cited by examiner

*Primary Examiner*—Hae Moon Hyeon
(74) *Attorney, Agent, or Firm*—Ladas and Parry LLP

(57) ABSTRACT

A mobile phone includes pivotally connected upper and lower members, and a coupling member interconnecting the upper member and a printed circuit board within the lower member in such a manner that the printed circuit board moves synchronously with the upper member to offset the printed circuit board with respect to a keypad, thereby preventing untimely and accidentally actuation the keypad when the upper member is disposed at a folded position with respect to the lower member.

8 Claims, 9 Drawing Sheets

TELECOMMUNICATION APPARATUS HAVING A COUPLING MEMBER TO PREVENT UNTIMELY ACTUATION OF THE KEYPAD

FIELD OF THE INVENTION

The present invention relates to a telecommunication apparatus, more particularly to a wireless telecommunication apparatus having a coupling member that is associated with a movable printed circuit board in such a manner to prevent untimely generation of a signal due to accidental contact between a keypad and the movable printed circuit board.

BACKGROUND OF THE INVENTION

A mobile phone of lately is designed in compact size in order to facilitate carrying thereof. The more convenient for the user to carry the mobile phone, the smaller the dimension should become. In order to eliminate the bulky size, some mobile phones are designed in foldable types (generally known as flip-phone). Referring to FIGS. 1A and 1B, a conventional mobile phone 10 is shown to include a lower casing 108, an upper casing 102 connected pivotally to the lower casing 108, and an antenna unit 112 projecting outwardly from the lower casing 108 for receiving and transmitting the radio signals. The upper casing 102 is provided with a minor window 104 via which suspending mode of the conventional mobile phone 10 can be observed. The upper casing 102 is turnable from the folded position shown in FIG. 1A to the unfolded position shown in FIG. 1B, in which, the upper casing 102 reveals a major window 106 to display the inputted information when the keypad 110 is operated.

In the aforesaid conventional mobile phone, means to prevent untimely and undesirable transmission is provided due to accidental actuation of the keypad 110. The preventing means includes a magnet member (not visible) disposed within the upper casing 102 and a sensor (not visible) provided in the lower casing 108 such that the sensor generates a circuit closing signal upon sensing the approach of the upper casing 102 relative to the lower casing 108. Under this condition, any inputted signal will not be processed when the mobile phone is at the folded position.

It is noted that the sensor is relatively slow to respond the approach of the upper casing so that undesired actuation of the keypad to generate transmission of signals is still possible. In addition, employment of the sensor, the magnetic member and the cost of writing software result extra manufacturing expense.

In order to eliminate the aforesaid disadvantage, a stopper is formed on the lower casing of another conventional mobile phone so as to space the keypad apart from the upper casing when at the folded position. Since the stopper, generally made from plastics or rubber, is susceptible to wearing and therefore succumbs to wearing and results in loss of its ability after a long period of use.

SUMMARY OF THE INVENTION

The object of the present invention is to provide a mobile phone having a coupling member that is associated with the printed circuit board in such a manner to prevent untimely generation of a signal due to accidental contact between the printed circuit board and a keypad.

A telecommunication apparatus in accordance with the present invention includes: a lower member; an upper member connected pivotally to the lower member to dispose the upper member between unfolded and folded positions with respect to the lower member; a printed circuit board disposed within the lower member; a keypad disposed above the printed circuit board and having a plurality of input keys for generating signals upon pressing to contact the printed circuit board; and a coupling member interconnecting the printed circuit board and the upper member to permit synchronous movement of the printed circuit board and the upper member with respect to the lower member. When the upper member is disposed at the folded position, the keypad is offset from the printed circuit board so as to dysfunction the input keys. When the upper member is disposed in the unfolded position, the keypad is aligned with the printed circuit board to function the input keys.

In a second aspect of the present invention, a coupling member is provided for use in a telecommunication apparatus that includes a lower member, an upper member connected pivotally to the lower member to dispose the upper member between unfolded and folded positions with respect to the lower member, a printed circuit board disposed in the lower member, and a keypad disposed above the printed circuit board and having a plurality of input keys for generating signals by pressing to contact the printed circuit board. The coupling member interconnects the printed circuit board and the upper member in such a manner to permit synchronous movement of the printed circuit board and the upper member with respect to the lower member, wherein when the upper member is disposed at the folded position, the keypad is offset from the printed circuit board so as to dysfunction the input keys and when the upper member is disposed in the unfolded position, the keypad is aligned with the printed circuit board to function the input keys. The coupling member includes: a cam fixed to the upper member and contacting one end of the printed circuit board for pushing the printed circuit board; and a spring member disposed in the lower member and urging the other end of the printed circuit board to offset from the key pad; wherein, movement of the upper member from unfolded position to the folded position results in compression of the spring member in order to offset the keypad from the printed circuit board, and movement of the upper member from folded position to the unfolded position results in decompression of the spring member so as to align the keypad with the printed circuit board.

In a third aspect of the present invention, a coupling member is provided for use in a telecommunication apparatus that includes a lower member, an upper member connected pivotally to the lower member to dispose the upper member between unfolded and folded positions with respect to the lower member, a printed circuit board disposed in the lower member, and a keypad disposed above the printed circuit board and having a plurality of input keys for generating signals upon pressing to contact the printed circuit board. The coupling member interconnects the printed circuit board and the upper member to permit synchronous movement of the printed circuit board and the upper member with respect to the lower member, wherein when the upper member is disposed at the folded position, the keypad is offset from the printed circuit board so as to dysfunction the input keys and when the upper member is disposed in the unfolded position, the keypad is aligned with the printed circuit board to function the input keys, the coupling member includes: a cam for fixing to the upper member; and a crank having a first end pivoted to the cam and a second end pivoted to the printed circuit board.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTIONS OF THE PREFERRED EMBODIMENTS

Figure 1A:
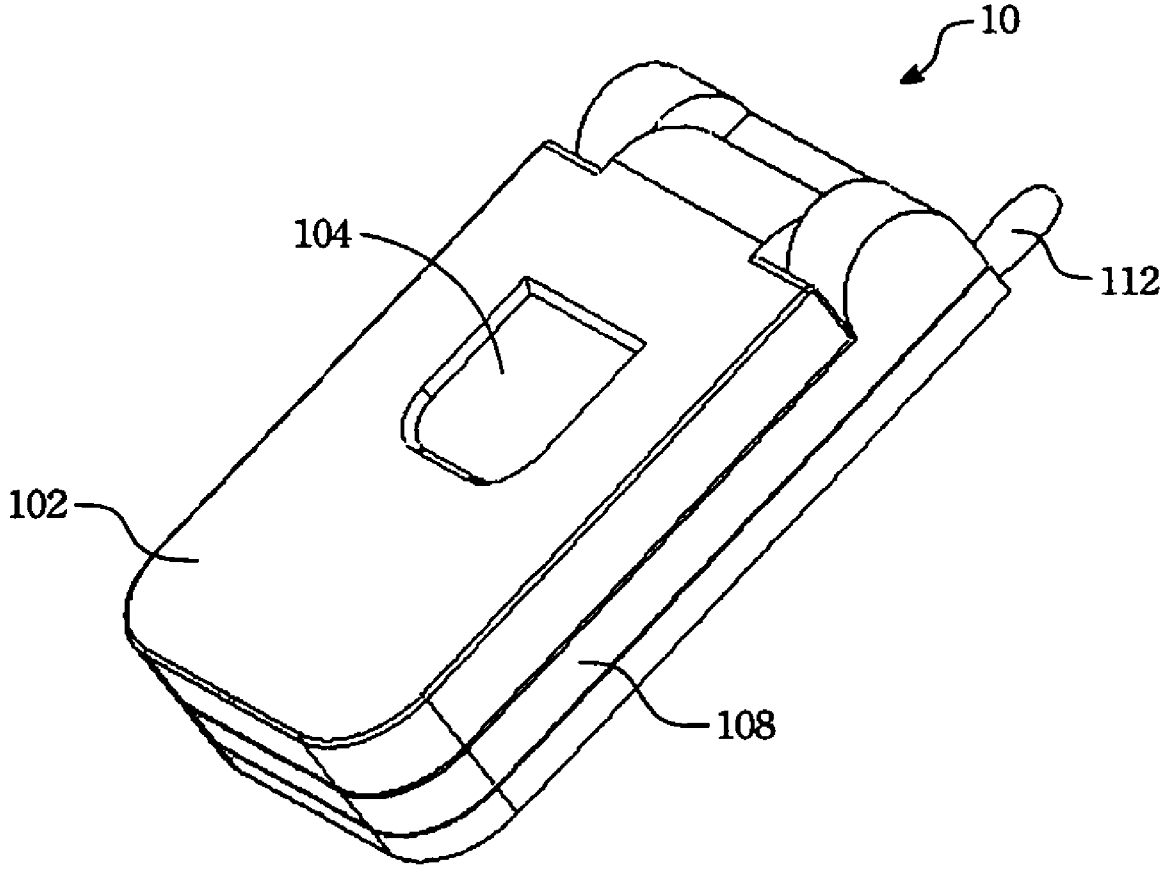
Fig.1A (Prior Art)
FIGS. 1A and 1B show perspective folded and unfolded views of a conventional mobile phone.
Figure 1B:
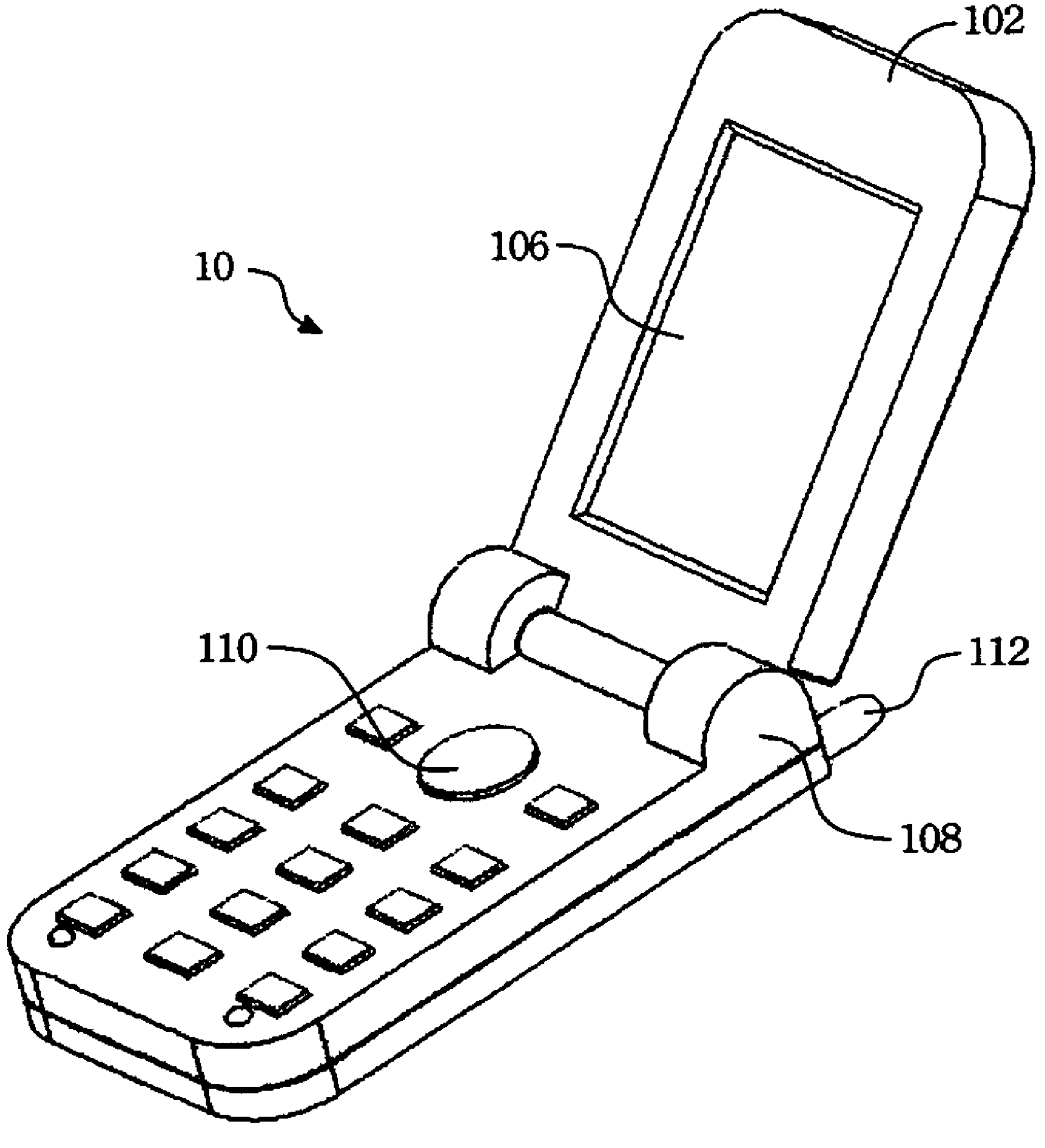
Fig. 1B (Prior Art)
Figure 2:
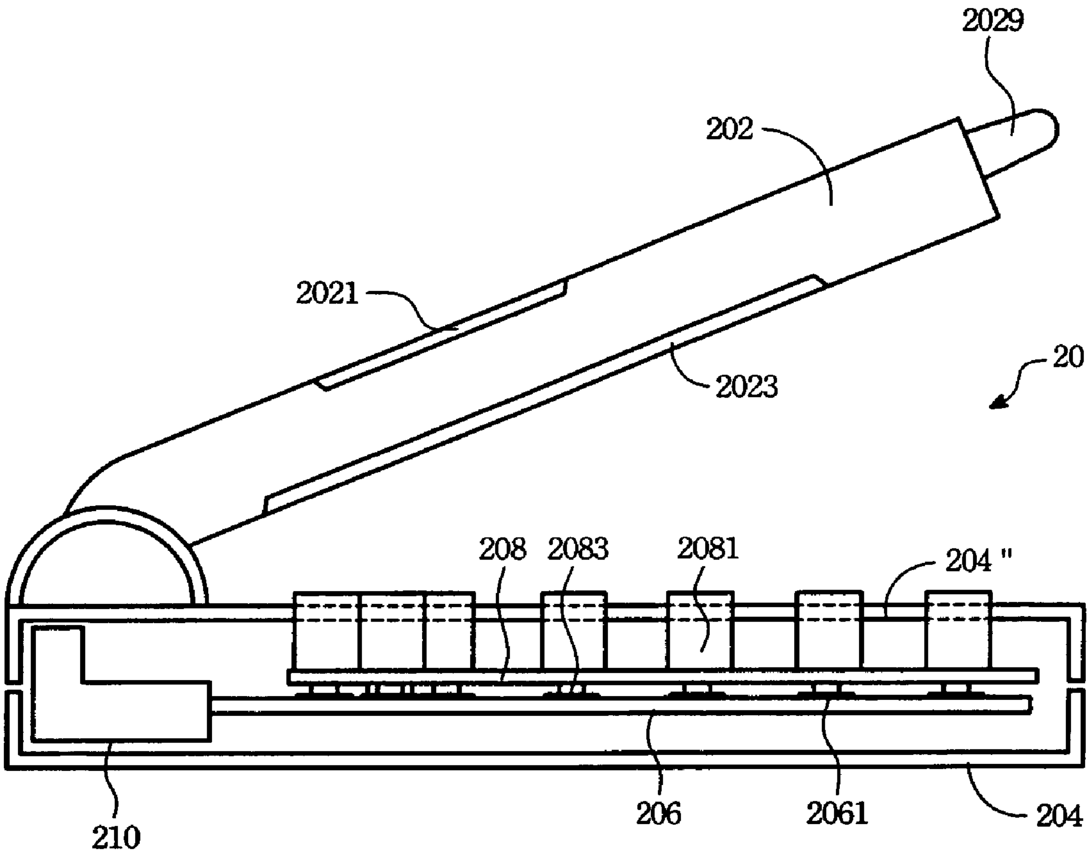
FIG. 2 is a side view of the first embodiment of a mobile phone of the present invention.

Referring to FIG. 2, a side view of the first embodiment of a wireless telecommunication apparatus (hereinafter a mobile phone) according to the present invention is shown to include a lower member 204, an upper member 202, a printed circuit board 206, a keypad 208, and a coupling member 210.

As illustrated, the upper member 202 is provided with major and minor windows 2023, 2021, and has an antenna unit 2029 for transmitting and receiving radio signals. The upper member 202 is connected pivotally to the lower member 204 so as to permit turning of the same between an unfolded position, in which, the upper member 202 is spaced apart from the lower member 204 (see FIG. 3C), and a folded position, in which, the upper member 202 contacts the lower member 204 (see FIG. 3D). The lower member 204 includes a casing 204" (see FIG. 2) that has front and rear ends and that receives the printed circuit board 206 movably therein (in the horizontal direction in the lower member). The printed circuit board 206 has a plurality of contact points 2061 (electrical contacts). In order to protect the components therein, each of the upper and lower members 202, 204 can be made from ABS plastics or metal in order to provide sufficient stiffness and rigidity, thereby achieving protection to the electronic components disposed therein.

The keypad 208 is disposed stationarily within the casing 204" at an elevation above the printed circuit board 206 (see FIG. 3A), and has a plurality of input keys 2081 that are aligned respectively with the contact points 2061 of the printed circuit board 206 and that project outwardly from an upper surface of the casing 204". Of course, a plurality of biasing members 2083 (such as elastomeric bodies or compression springs) are disposed between the printed circuit board 206 and the keypad 208, wherein each biasing member 2083 has top and bottom ends respectively biasing against the keypad 208 and the printed circuit board 206 in order to space the two apart from each other. Under this condition and when the upper member 202 is disposed at the unfolded position, a downward actuation of a respective input key 2081 against biasing action of a respective biasing member 2083 can result in contact between a respective one of the contact points 2061 and the respective input key 2081 to generate a signal. Since the construction of the printed circuit board 206 and the keypad 208 is not the relevant feature of the present invention, a detailed description thereof is omitted herein for the sake of brevity.

The coupling member 210 is disposed in the casing 204" (the lower member) and interconnects the printed circuit board 206 and the upper member 202 in such a manner to permit synchronous movement of the printed circuit board 206 and the upper member 202 with respect to the casing 204". When the upper member 202 is disposed in the unfolded position, the input keys 2081 of the keypad 208 are aligned respectively with the contact points 2061 of the printed circuit board 206 (see FIG. 2). When the upper member 202 is disposed at the folded position, the input keys 2081 of the keypad 208 are offset respectively from the contact points of the printed circuit board 206 (see FIG. 3D). Under this condition, in case the input keys are pressed accidentally, no signal will be generated by virtue of non-alignment between the input keys 2081 and the contact points 2061.

Figure 3A:
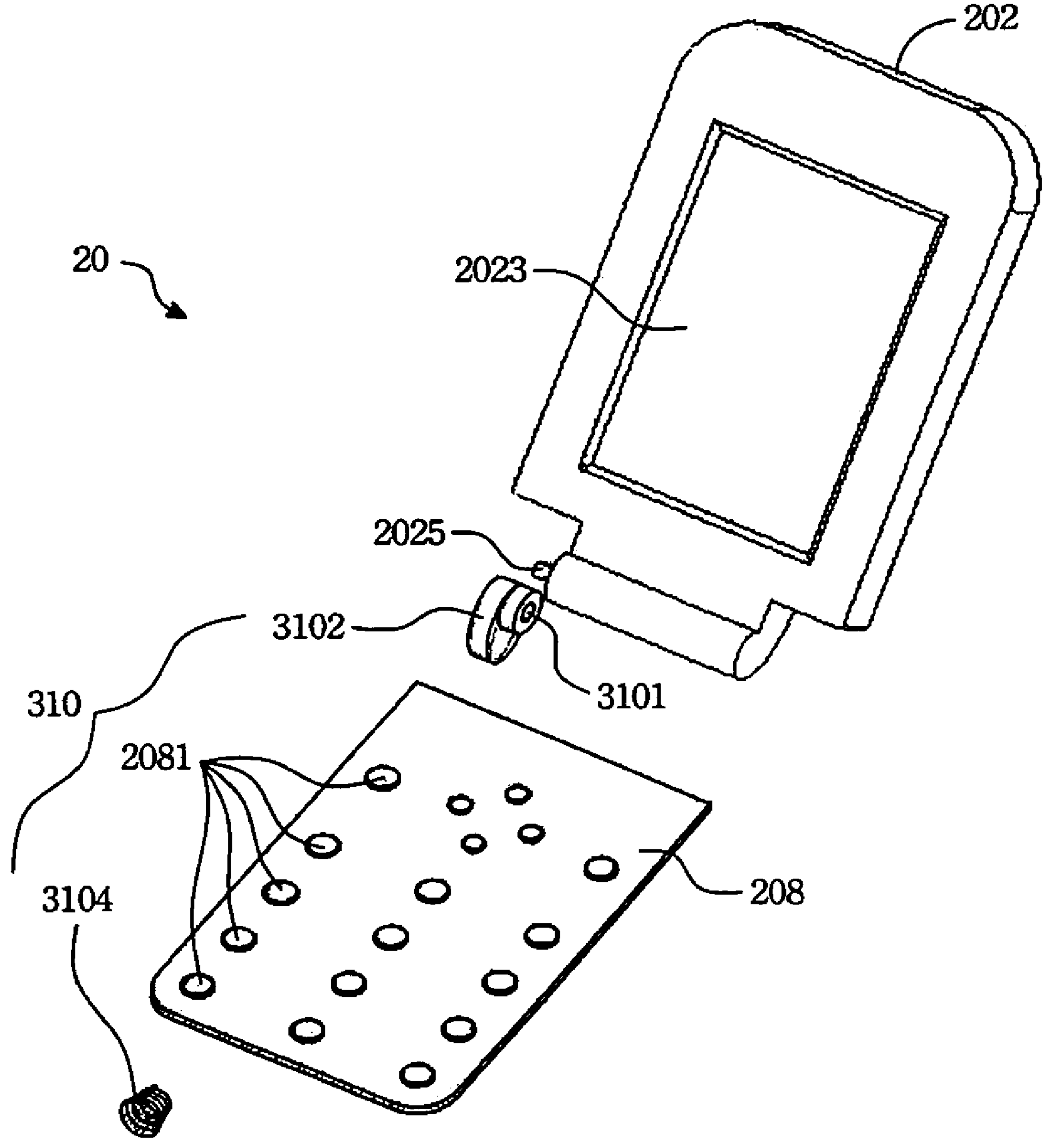
FIG. 3A is a fragmentary and partly exploded view of the first embodiment of the mobile phone according to the present invention.
Figure 3B:
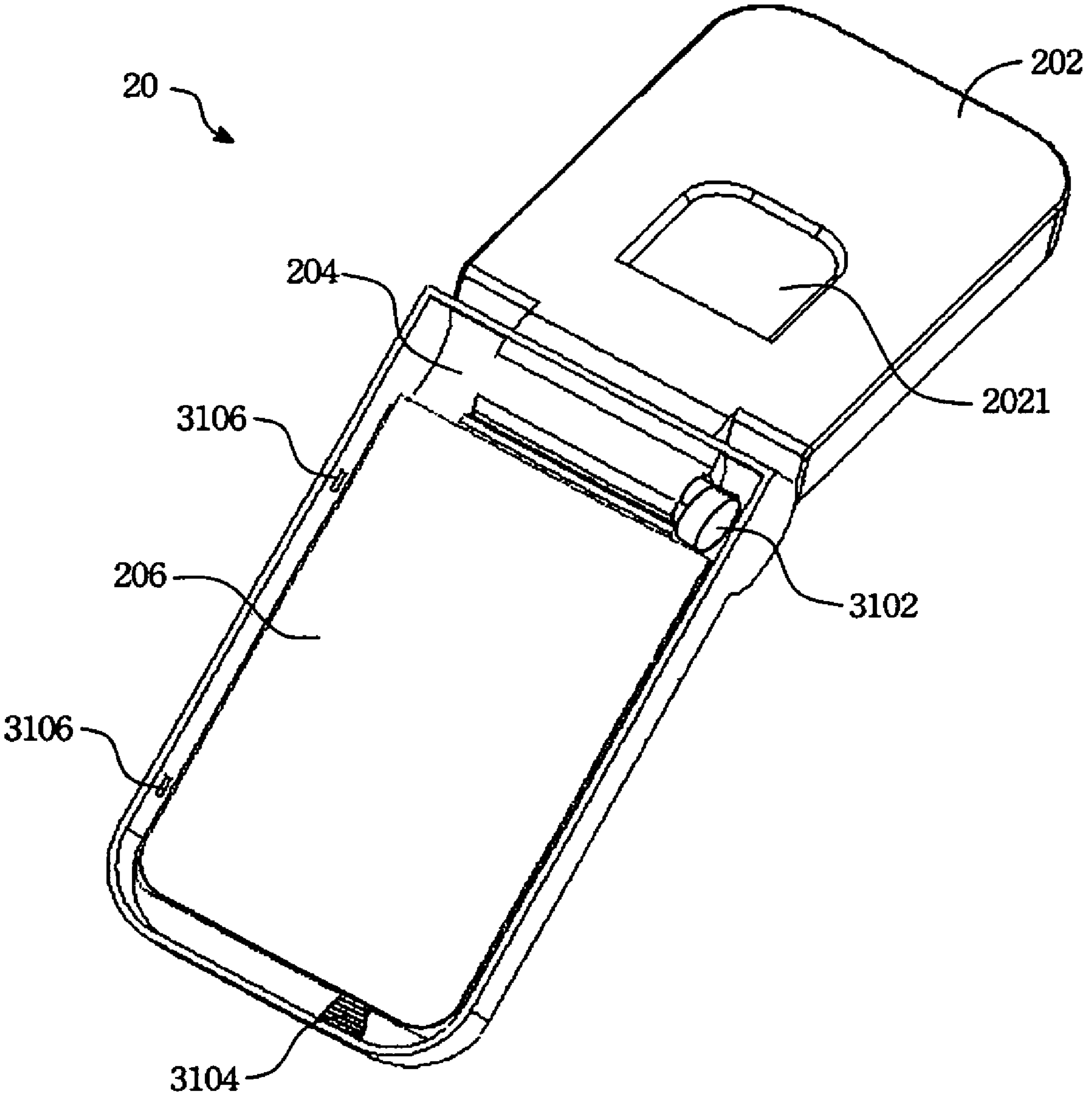
FIG. 3B is a perspective bottom planar view of the first embodiment according to the present invention.

In order to better understanding of the present invention, a detailed description of the embodiments are given in the following paragraphs. Referring to FIGS. 3A and 3B, the coupling member 310 of the first embodiment of the present invention includes a cam 3102, a spring member 3104 and two restricting members 3106. In this embodiment, the upper member 202 is formed with a lateral boss 2025. The cam 3102 is fixed on the upper member 202 and has a concave recess 3101 to receive the lateral boss 2025.

Referring to FIG. 3B, the cam 3102 contacts slidably one end of the printed circuit board 206. The spring member 3104, preferably a coil spring, is disposed in the casing 204" for urging the other end of the printed circuit board 206 forward in such a manner that when the upper member 202 is disposed at the folded position shown in FIG. 3D, the contact points 2061 of the printed circuit board 206 are offset respectively from the input keys 2081 of the keypad 208. However, movement of the upper member 202 from the folded position to the unfolded position can result in compression of the coil spring 3104 (see FIG. 3C) and movement of the printed circuit board 206 respect to the keypad 208 in the horizontal direction in order to align the contact points 2061 of the printed circuit board 206 with the input keys 2081 of the keypad 208, since the printed circuit board 206 is restricted from movement in an up-and-downward direction of the lower member 204.

Figure 3C:
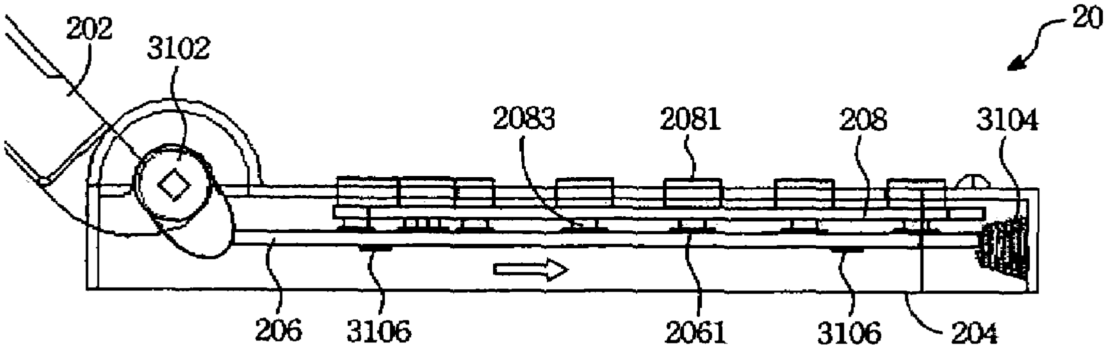
FIG. 3C is a side view of the first embodiment when the latter is disposed at an unfolded position.
Figure 3D:
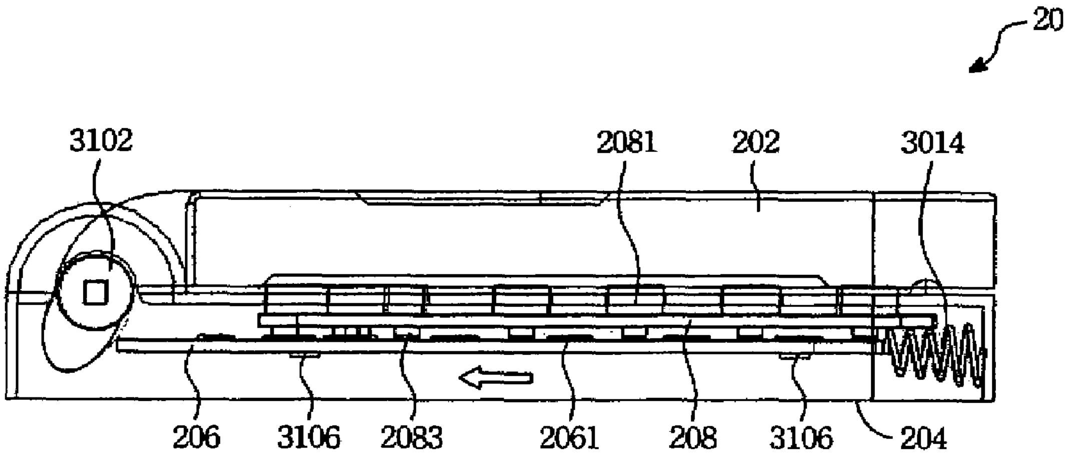
FIG. 3D is a perspective view of the first embodiment when the latter is disposed at a folded position.

FIGS. 3C and 3D respectively illustrate side views of unfolded and folded position of the upper member 202 with respect to the lower member 204, wherein the cam 3102 is in slidable contact with the front end of the printed circuit board 206. When the upper member 202 is disposed in the unfolded position, the input keys 2081 of the keypad 208 are aligned respectively with the contact points 2061 of the printed circuit board 206. Under this condition, a downward actuation of a respective input key 2081 can result in contact between a respective one of the contact points 2061 and the respective input key 2081 to generate the signal.

In contrast, when the upper member 202 is disposed at the folded position, the input keys 2081 of the keypad 208 are offset respectively from the contact points of the printed circuit board 206 (see FIG. 3D). Under this condition, in case the input keys are pressed accidentally, no signal will be generated by virtue of non-alignment between the input keys 2081 and the contact points 2061.

An important to note is that the cam 3102 may be of any configuration so long as its circular rotation can cause linear movement of the printed circuit board 206 in the front-and-rear direction within the casing 204". In this embodiment, the printed circuit board 206 is enhanced by virtue of the presence of the coil spring 3104 that constantly urges the printed circuit board 206 to bias against the cam 3102. Otherwise, the front end of the printed circuit board 206 should be connected pivotally to the cam 3102. Preferably, the two restricting members 3106 are disposed within the casing 204" at the right side of the printed circuit board 206 (see FIG. 3B) to confine movement of the printed circuit board 206 only in the front-and rear direction of the casing 204".

Figure 4A:
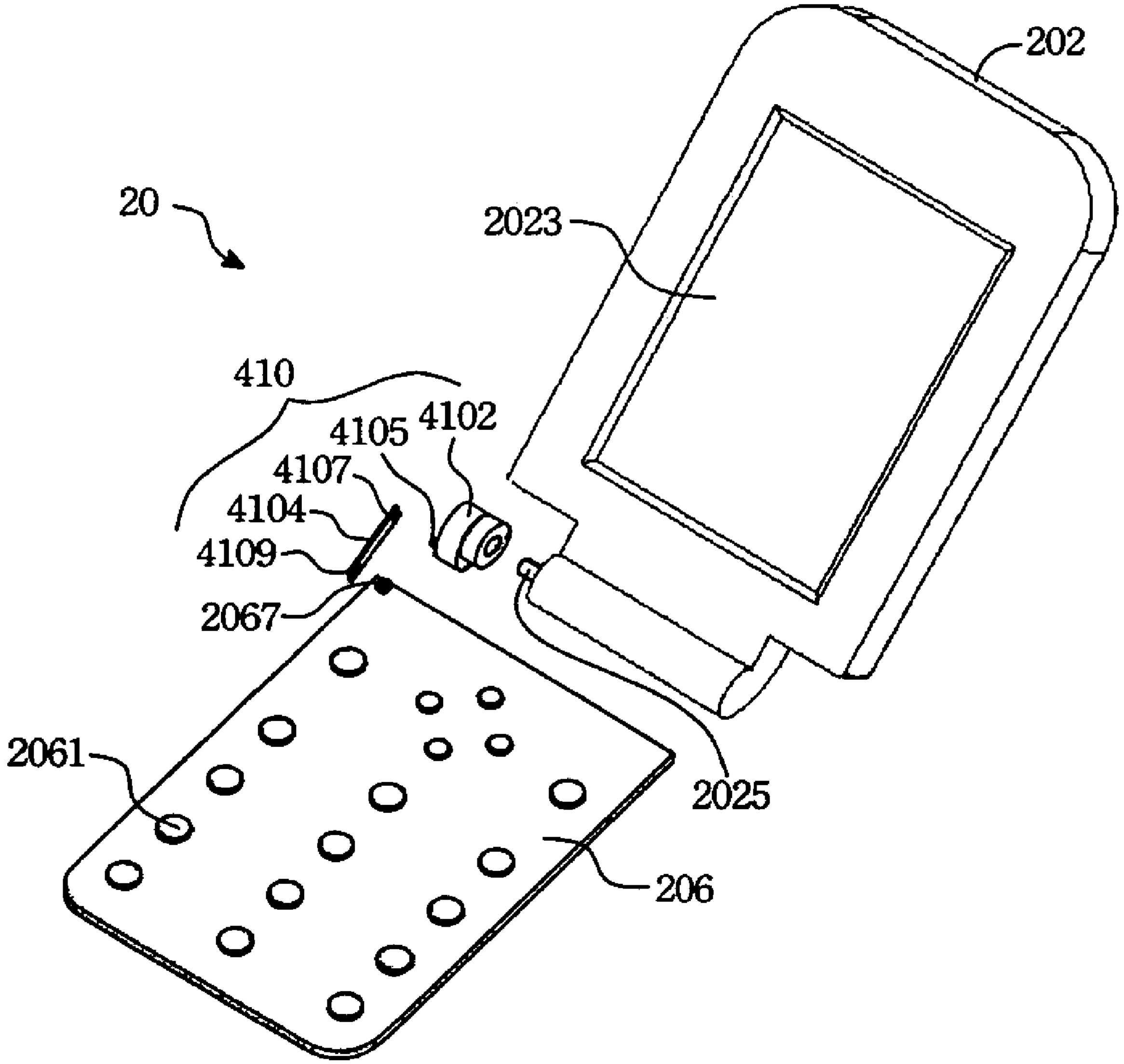
FIG. 4A is a fragmentary and partly exploded view of the second embodiment of the mobile phone according to the present invention.
Figure 4B:
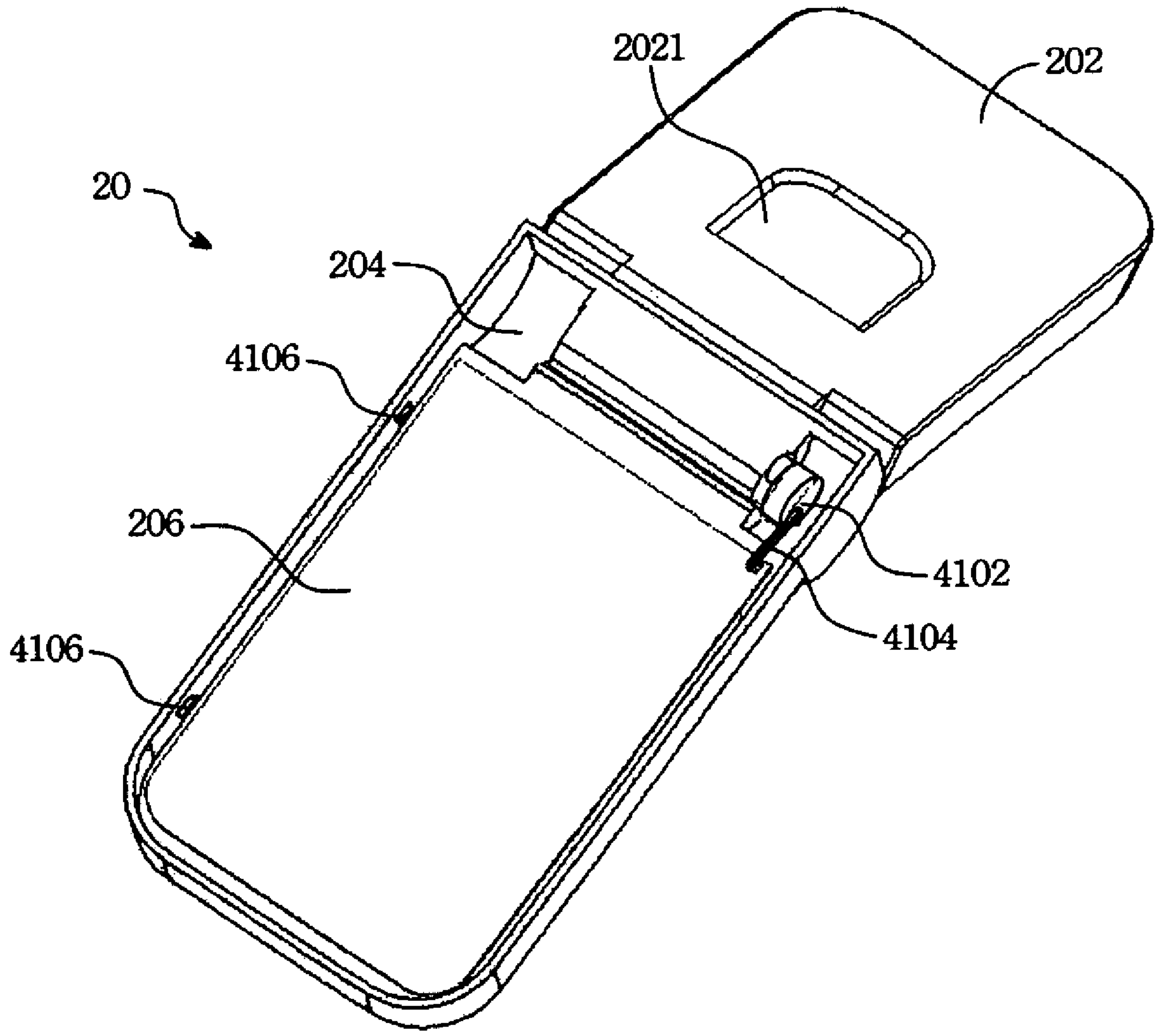
FIG. 4B is a perspective bottom planar view of the second embodiment of the mobile phone according to the present invention.

Referring to FIGS. 4A to 4B, the second embodiment of the mobile phone according to the present invention is shown to have the construction the same as the first embodiment. The only difference resides in that of the cam 3102 and the coil spring 3104. The coupling member 410 of the second embodiment includes a cam 4102, a crank 4104, and two restricting member 4106. The upper member 202 is formed with a lateral boss 2025 extending into the concave recess in the cam 4102.

As shown in FIG. 4B, the crank 4104 has a first end 4107 coupled pivotally to the pin 4105 of the cam 4102 (see FIG. 4A) and a second end 4109 pivoted to a pin 2067 (see FIG. 4A) projecting outward from the front end of the printed circuit board 206. Since the crank 4104 moves synchronously with the cam 4102 such that rotation of the upper member 202 between unfolded and folded positions with respect to the lower member 204 results in alignment and offset between the input keys 2081 of the keypad 208 and the contact points 2061 of the printed circuit board 206.

Figure 4C:
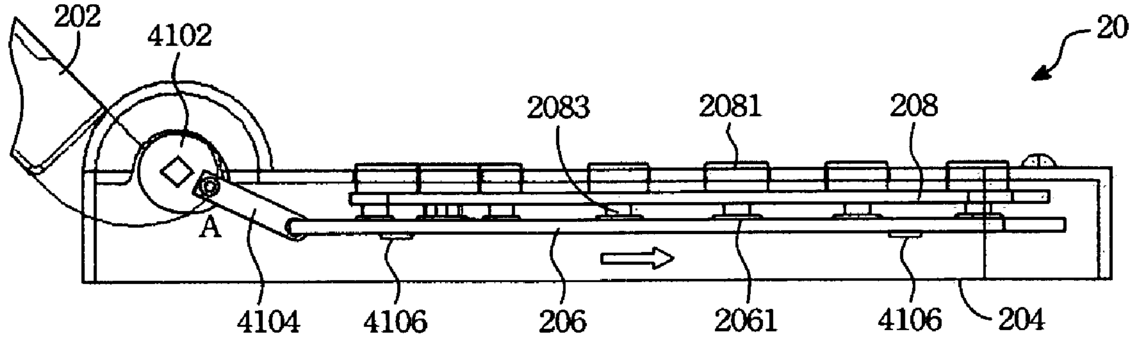
FIG. 4C is a side view of the second embodiment when the latter is disposed at an unfolded position.
Figure 4D:
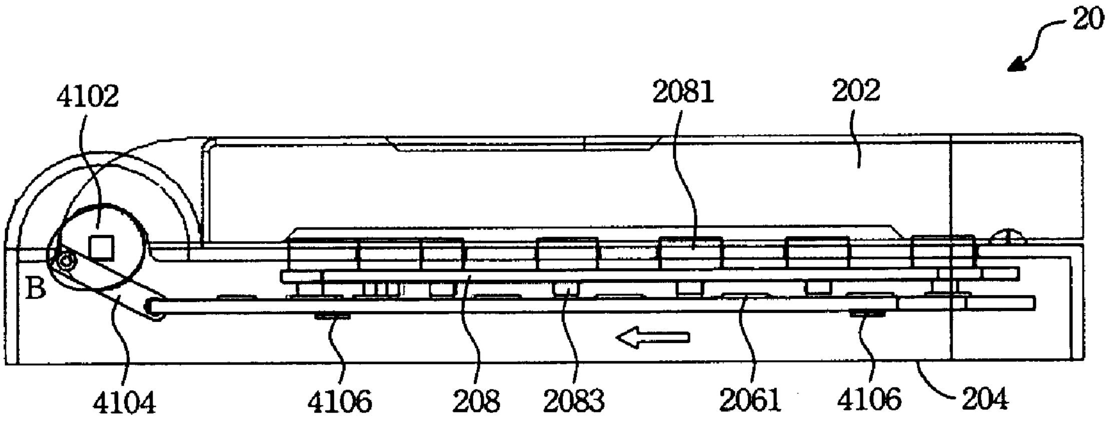
FIG. 4D is a side view of the second embodiment when the latter is disposed at a folded position.

FIGS. 4C and 4D respectively illustrate side views of unfolded and folded position of the upper member 202 with respect to the lower member 204. Rotation of the upper member 202 to the unfolded position results in the rearward movement of the printed circuit board 206 along the horizontal direction within the lower member 204 so as to align the input keys 2081 of the keypad 208 respectively with the contact points 2061 of the printed circuit board 206. Under this condition, a downward actuation of a respective input key 2081 can result in contact between a respective one of the contact points 2061 and the respective input key 2081 to generate the signal.

In contrast, rotation of the upper member 202 to the folded position from the unfolded position results in the forward movement of the printed circuit board 206 along the horizontal direction within the lower member 204 so as to offset the input keys 2081 of the keypad 208 respectively from the contact points 2061 of the printed circuit board 206 (see FIG. 4D). Under this condition, in case the input keys are pressed accidentally, no signal will be generated by virtue of non-alignment between the input keys 2081 and the contact points 2061.

An important to note that the present invention provides a coupling member of simple structure to eliminate the drawbacks encountered during manufacture of the conventional mobile phone. Note that no the complicated process is involved for producing the coupling member used in the present mobile phone, thereby reducing the manufacturing cost. In addition, since the coupling member is enclosed within the casing of the present mobile phone, the outward appearance thereof is not affected.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A telecommunication apparatus comprising:
- a lower member;
- an upper member connected pivotally to the lower member to dispose the upper member between unfolded and folded positions with respect to the lower member;
- a printed circuit board disposed within the lower member;
- a keypad disposed above the printed circuit board, and having a plurality of input keys for generating signals upon pressing to contact the printed circuit board; and
- a coupling member, disposed in the lower member, interconnecting the printed circuit board and the upper member to permit synchronous movement of the printed circuit board and the upper member with respect to the lower member;
- wherein when the upper member is disposed at the folded position, the keypad is offset from the printed circuit board so as to dysfunction the input keys and when the upper member is disposed in the unfolded position, the keypad is aligned with the printed circuit board to function the input keys.

2. The telecommunication apparatus according to claim 1, wherein the coupling member further includes:
- a cam fixed to the upper member and contacting one end of the printed circuit board for pushing the printed circuit board; and
- a spring member disposed in the lower member and urging the other end of the printed circuit board to offset from the keypad;
- wherein, movement of the upper member from unfolded position to the folded position results in compression of the spring member in order to offset the keypad from the printed circuit board, and movement of the upper member from folded position to the unfolded position results in decompression of the spring member so as to align the keypad with the printed circuit board.

3. The telecommunication apparatus according to claim 1, wherein the coupling member includes:
- a cam fixed to the upper member for moving together therewith; and
- a crank interconnecting the cam and the printed circuit board so that synchronous movement of the upper member and the cam results in movement of the printed circuit board.

4. The telecommunication apparatus according to claim 2, wherein the coupling member further includes at least one restricting member disposed within the lower member to confine movement of the printed circuit board within the lower member in a horizontal direction.

5. A coupling member for use in a telecommunication apparatus that includes a lower member, an upper member connected pivotally to the lower member to dispose the upper member between unfolded and folded positions with respect to the lower member, a printed circuit board disposed in the lower member, and a keypad disposed above the printed circuit board and having a plurality of input keys for generating signals by pressing to contact the printed circuit board, the coupling member disposed in the lower member and interconnecting the printed circuit board and the upper member in such a manner to permit synchronous movement of the printed circuit board and the upper member with respect to the lower member, the coupling member comprising:

a cam for fixing to the upper member and contacting one end of the printed circuit board in order to push the printed circuit board; and a spring member for disposing in the lower member to urge the other end of the printed circuit board to offset from the keypad;

wherein, movement of the upper member from unfolded position to the folded position results in compression of the spring member in order to offset the keypad from the printed circuit board, and movement of the upper member from folded position to the unfolded position results in decompression of the spring member so as to align the keypad with the printed circuit board.

6. The coupling member according to claim 5, further comprising at least one restricting member for disposing within the lower member to confine movement of the printed circuit board within the lower member in a horizontal direction.

7. A coupling member for use in a telecommunication apparatus that includes a lower member, an upper member connected pivotally to the lower member to dispose the upper member between unfolded and folded positions with respect to the lower member, a printed circuit board disposed in the lower member, and a keypad disposed above the printed circuit board and having a plurality of input keys for generating signals upon pressing to contact the printed circuit board, the coupling member disposed in the lower member and interconnecting the printed circuit board and the upper member to permit synchronous movement of the printed circuit board and the upper member with respect to the lower member, the coupling member comprising:

a cam for fixing to the upper member; and a crank for interconnecting the cam and the printed circuit board so that synchronous movement of the upper member and the cam results in movement of the printed circuit board.

8. The coupling member according to claim 7, the coupling member further comprising at least one restricting member disposed within the lower member to confine movement of the printed circuit board within the lower member in a horizontal direction.

* * * * *